(12) United States Patent
Jain et al.

(10) Patent No.: US 12,105,145 B2
(45) Date of Patent: Oct. 1, 2024

(54) SCAN COMPRESSION THROUGH PIN DATA ENCODING

(71) Applicant: STMicroelectronics International N.V., Geneva (CH)

(72) Inventors: Sandeep Jain, Noida (IN); Shalini Pathak, Gurgaon (IN)

(73) Assignee: STMicroelectronics International N.V., Geneva (CH)

(*) Notice: Subject to any disclaimer, the term of this patent is extended or adjusted under 35 U.S.C. 154(b) by 0 days.

(21) Appl. No.: 18/362,550

(22) Filed: Jul. 31, 2023

(65) Prior Publication Data

US 2023/0375617 A1    Nov. 23, 2023

Related U.S. Application Data

(63) Continuation of application No. 17/747,331, filed on May 18, 2022, now Pat. No. 11,782,092.

(51) Int. Cl.
*G01R 31/3185* (2006.01)
*G01R 31/317* (2006.01)
*G01R 31/3183* (2006.01)

(52) U.S. Cl.
CPC ... *G01R 31/318536* (2013.01); *G01R 31/317* (2013.01); *G01R 31/318335* (2013.01); *G01R 31/31853* (2013.01); *G01R 31/318533* (2013.01); *G01R 31/318555* (2013.01); *G01R 31/318558* (2013.01); *G01R 31/318566* (2013.01)

(58) Field of Classification Search
CPC .......... G01R 31/318536; G01R 31/317; G01R 31/318533; G01R 31/318555; G01R 31/318558; G01R 31/318566; G01R 31/31853; G01R 31/318335
USPC ......................... 714/726, 729, 732, 736, 742
See application file for complete search history.

(56) References Cited

U.S. PATENT DOCUMENTS

| | | | |
|---|---|---|---|
| 6,106,568 A | 8/2000 | Beausang | |
| 6,865,704 B2 | 3/2005 | Whannel | |
| 7,032,148 B2* | 4/2006 | Wang | G01R 31/318536 714/729 |
| 7,343,536 B2 | 3/2008 | Han | |
| 7,412,672 B1* | 8/2008 | Wang | G01R 31/31926 716/136 |
| 7,673,208 B2* | 3/2010 | Seuring | G06F 11/2242 714/724 |

(Continued)

OTHER PUBLICATIONS

Chandra, Anshuman et al., "Interval Based X-masking for Scan Compression Architectures," 9th International Symposium on Quality Electronic Design, 2008, IEEE, pp. 821-826. (Year: 2008).

(Continued)

*Primary Examiner* — John J Tabone, Jr.
(74) *Attorney, Agent, or Firm* — Slater Matsil, LLP

(57) ABSTRACT

A method for testing a chip comprising receiving N scan-in chains of test data; using the N scan-in chains of test data to perform tests on the chip; receiving a merged expected test-result and masking-instruction signal on X pins of the chip from the off-chip test equipment, X being less than 2*N; decoding the merged expected test-result and masking-instruction signal to extract N decoded output signals, each of the N decoded output signals corresponding to a respective chain of test results.

20 Claims, 9 Drawing Sheets

(56) References Cited

U.S. PATENT DOCUMENTS

| | | | |
|---|---|---|---|
| 7,689,884 B2* | 3/2010 | Seuring | G01R 31/318561 714/724 |
| 7,913,137 B2 | 3/2011 | Mukherjee et al. | |
| 8,250,420 B2* | 8/2012 | Hapke | G01R 31/31919 714/728 |
| 8,418,007 B2* | 4/2013 | Mukherjee | G01R 31/31727 714/732 |
| 8,650,524 B1 | 2/2014 | Chakravadhanula | |
| 8,914,694 B2 | 12/2014 | Mukherjee et al. | |
| 9,091,729 B2* | 7/2015 | Narayanan | G01R 31/318536 |
| 9,250,287 B2 | 2/2016 | Mukherjee et al. | |
| 9,355,203 B2* | 5/2016 | Douskey | G06F 30/398 |
| 9,766,289 B2* | 9/2017 | Parasrampuria | G01R 31/318385 |
| 10,031,181 B1 | 7/2018 | Solt | |
| 10,591,540 B2 | 3/2020 | Narayanan et al. | |
| 11,782,092 B1* | 10/2023 | Jain | G01R 31/3187 714/726 |
| 2005/0060625 A1* | 3/2005 | Wang | G01R 31/318536 714/727 |
| 2007/0162803 A1 | 7/2007 | Dervisoglu | |
| 2008/0148117 A1* | 6/2008 | Seuring | G01R 31/318561 714/726 |
| 2010/0090706 A1* | 4/2010 | Malach | G01R 31/318547 324/537 |
| 2010/0169856 A1 | 7/2010 | Hom et al. | |
| 2013/0305106 A1 | 11/2013 | Mittal | |
| 2014/0032986 A1 | 1/2014 | Wan et al. | |
| 2015/0006987 A1 | 1/2015 | Narayanan et al. | |
| 2015/0185285 A1 | 7/2015 | Kovalev et al. | |
| 2015/0338461 A1* | 11/2015 | Wang | G01R 31/3177 714/727 |
| 2017/0097388 A1* | 4/2017 | Parasrampuria | G01R 31/318547 |
| 2020/0333397 A1 | 10/2020 | Kawoosa | |
| 2020/0341057 A1 | 10/2020 | Cheng | |
| 2022/0308110 A1* | 9/2022 | Liu | G01R 31/3177 |
| 2023/0375617 A1* | 11/2023 | Jain | G01R 31/318533 |

OTHER PUBLICATIONS

Liu, Yingdi et al., "X-Tolerant Tunable Compactor for In-System Test," 2020, IEEE, International Test Conference, pp. 1-10, Year: 2020.

Rabenalt, Thomas et al., "Masking of X-values by Use of a Hierarchically Configurable Register," 2009 European Test Symposium, IEEE, pp. 149-154, Year: 2009.

Tyszer, Jerzy et al., "X-Tolerant Compactor with On-Chip Registration and Signature-Based Diagnosis," 2007, IEEE, pp. 476-485. Year: 2007.

* cited by examiner

FIG. 7

| States | Scan-out values | | | Encoded data loaded through scan-pins as inputs | | | | |
|---|---|---|---|---|---|---|---|---|
| | SO_2 | SO_1 | SO_0 | RSI0 | RSI1 | RSI2 | RSI3 | RSI4 |
| 0 | 0 | 0 | 0 | 0 | 0 | 0 | 0 | 0 |
| 1 | 0 | 0 | 1 | 0 | 0 | 0 | 0 | 1 |
| 2 | 0 | 0 | M | 0 | 0 | 0 | 1 | 0 |
| 3 | 0 | 1 | 0 | 0 | 0 | 0 | 1 | 1 |
| 4 | 0 | 1 | 1 | 0 | 0 | 1 | 0 | 0 |
| 5 | 0 | 1 | M | 0 | 0 | 1 | 0 | 1 |
| 6 | 0 | M | 0 | 0 | 0 | 1 | 1 | 0 |
| 7 | 0 | M | 1 | 0 | 0 | 1 | 1 | 1 |
| 8 | 0 | M | M | 0 | 1 | 0 | 0 | 0 |
| 9 | 1 | 0 | 0 | 0 | 1 | 0 | 0 | 1 |
| 10 | 1 | 0 | 1 | 0 | 1 | 0 | 1 | 0 |
| 11 | 1 | 0 | M | 0 | 1 | 0 | 1 | 1 |
| 12 | 1 | 1 | 0 | 0 | 1 | 1 | 0 | 0 |
| 13 | 1 | 1 | 1 | 0 | 1 | 1 | 0 | 1 |
| 14 | 1 | 1 | M | 0 | 1 | 1 | 1 | 0 |
| 15 | 1 | M | 0 | 0 | 1 | 1 | 1 | 1 |
| 16 | 1 | M | 1 | 1 | 0 | 0 | 0 | 0 |
| 17 | 1 | M | M | 1 | 0 | 0 | 0 | 1 |
| 18 | M | 0 | 0 | 1 | 0 | 0 | 1 | 0 |
| 19 | M | 0 | 1 | 1 | 0 | 0 | 1 | 1 |
| 20 | M | 0 | M | 1 | 0 | 1 | 0 | 0 |
| 21 | M | 1 | 0 | 1 | 0 | 1 | 0 | 1 |
| 22 | M | 1 | 1 | 1 | 0 | 1 | 1 | 0 |
| 23 | M | 1 | M | 1 | 0 | 1 | 1 | 1 |
| 24 | M | M | 0 | 1 | 1 | 0 | 0 | 0 |
| 25 | M | M | 1 | 1 | 1 | 0 | 0 | 1 |
| 26 | M | M | M | 1 | 1 | 0 | 1 | 0 |
| 27 | *Unused States* | | | 1 | 1 | 0 | 1 | 1 |
| 28 | | | | 1 | 1 | 1 | 0 | 0 |
| 29 | | | | 1 | 1 | 1 | 0 | 1 |
| 30 | | | | 1 | 1 | 1 | 1 | 0 |
| 31 | | | | 1 | 1 | 1 | 1 | 1 |

SCAN COMPRESSION THROUGH PIN DATA ENCODING

CROSS-REFERENCE TO RELATED APPLICATIONS

This application is a continuation of U.S. application Ser. No. 17/747,331, filed on May 18, 2022, which application is hereby incorporated by reference herein in its entirety.

TECHNICAL FIELD

The present invention relates generally to systems and devices for on-chip scan chain testing and result comparison.

BACKGROUND

Various device testing may be performed by loading test data onto a chip from external testing equipment. The data may be stored into test registers. After tests have been performed the test results may be stored in test registers and output to the external testing equipment for comparing the actual test results with expected results. Moving this comparison onto the chip can save time in the testing process. As chips become more and more complex the need to perform these tests quickly also becomes more and more desirable.

SUMMARY

In accordance with embodiments, a method for testing a chip with an on-chip comparator comprises receiving, by the chip, N scan-in chains of test data from an off-chip test equipment, N being an integer; using the N scan-in chains of test data to perform tests on the chip that produce test results; receiving a merged expected test-result and masking-instruction signal on X pins of the chip from the off-chip test equipment, X being an integer less than 2*N; decoding the merged expected test-result and masking-instruction signal to extract N decoded output signals, each of the N decoded output signals corresponding to a respective chain of test results; for each decoded output signal comprising an expected test result, using the on-chip comparator to compare the decoded output signal with the respective chain of test results for that decoded output signal; and for each decoded output signal comprising a masking condition, masking from comparison the respective test chain of test results for that decoded output signal.

In accordance with embodiments, A chip with an on-chip comparator comprises N input pins configured to receive N scan-in chains that comprise test data, N being an integer; a plurality of scan-chain test registers configured to store test data from the N scan-in chains for on-chip tests and to store results from on-chip tests; decoding logic configured to receive a merged test-result and masking-instruction signal from X input pins and output N decoded output signals decoded from the merged test-result and masking-instruction signal wherein X is an integer less than 2*N; and wherein the on-chip comparator is coupled with the plurality of scan-chain test registers to receive test results from the plurality of scan-chain test registers and wherein the on-chip comparator is coupled with the decoding logic to receive the N decoded output signals, the on-chip comparator being configured to compare each of the N decoded output signals comprising an expected test result with a respective test result chain and configured to mask from comparison each of the N decoded output signals comprising a mask instruction.

In accordance with embodiments, a system to test a chip comprises an off-chip test equipment; N input pins coupled with the off-chip test equipment to receive N scan-in chains that comprise test data, N being an integer; a plurality of scan-chain test registers configured to store test data from the N scan-in chains for on-chip tests and to store results from on-chip tests; decoding logic configured to receive a merged test-result and masking-instruction signal from X input pins and output N decoded output signals decoded from the merged test-result and masking-instruction signal wherein X is an integer less than 2*N, the X input pins being coupled with the off-chip testing equipment; and an on-chip comparator is coupled with the plurality of scan-chain test registers to receive test results from the plurality of scan-chain test registers and wherein the on-chip comparator is coupled with the decoding logic to receive the N decoded output signals, the on-chip comparator being configured to compare each of the N decoded output signals comprising an expected test result with a respective test result chain and configured to mask from comparison each of the N decoded output signals comprising a mask instruction.

BRIEF DESCRIPTION OF THE DRAWINGS

For a more complete understanding of the present invention, and the advantages thereof, reference is now made to the following descriptions taken in conjunction with the accompanying drawings, in which:

FIG. 7 depicts an example table mapping five binary input states to data comprising three possible states.

DETAILED DESCRIPTION OF ILLUSTRATIVE EMBODIMENTS

Inputs are used to load data onto a chip to perform on chip testing. The data may be provided by off chip testing equipment such as Automatic Testing Equipment (ATE). The data, or test patterns, is/are loaded serially onto the chip using input pins for the chip. The data is stored on test registers where it can be provided to on-chip components for testing purposes. Data may be input into a device under test as a scan chain and stored on a corresponding test register or corresponding test registers. After tests are performed, the results are stored in test registers. Known systems and devices output the data via output pins to the external test equipment (such as an ATE), where the test results may be compared with expected results to determine whether the chip is functioning as desired.

Figure 1:
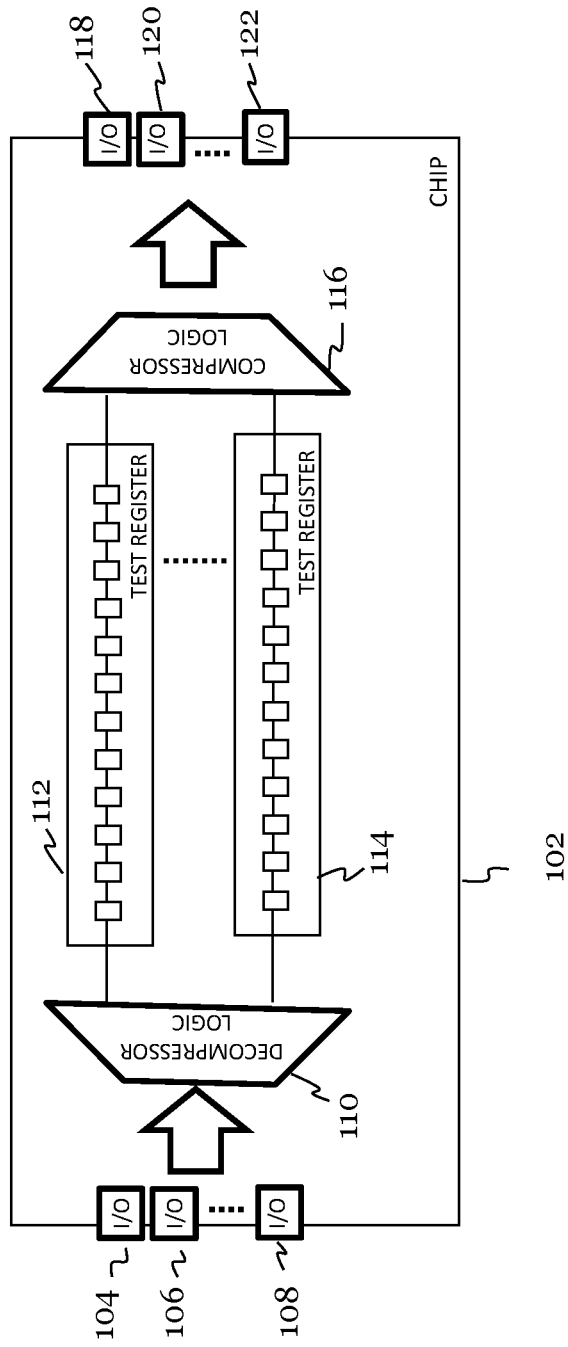
FIG. 1 shows a chip comprising a known scan-in and scan-out architecture for performing on-chip tests.

FIG. 1 shows a chip comprising a known scan-in and scan-out architecture for performing on-chip tests.

The chip 102 includes a number of inputs to receive a compressed data signal that is decompressed and loaded into scan chains for the chip. The chip 102 may include a first input 104, a second input 106, and an Nth input. Data (scan-in chains) received at the inputs may be provided to decompressor logic 110 where the compressed signal is expanded. Each pin may receive a scan-in chain. The expanded data may then be provided to a number of test registers. A first test register 112 may receive a first section of data, a second register may receive a second section of data, and so forth. An Nth test register 114 may receive an Nth section of data. The registers may be loaded in parallel in a serial manner, meaning each register may receive one bit per cycle.

Once the test registers are loaded, the data may be supplied to other components on the chip 102 for testing. The results of the test may then be stored in the test registers. The first test register 112 may store a first section of test results, a second test register (not shown in FIG. 1) may store a second section of test results and so forth. The Nth test register may store an Nth section of test results.

The results of the tests may be provided to compressor logic 116. The data may be compressed into scan-out chains. The number of scan-out chains may correspond to the number of scan in chains. The scan-out chains are then provided to output pins for transmission to off-chip testing equipment such as automatic testing equipment. The chip 102 includes a first output 118, a second output 120, and so on, up to an Nth output 122 to output the scan-out chains Once the compressed output data is received by the off-chip testing equipment, the test results may be evaluated. This can be accomplished by comparing the results with expected results. When the test results do not match the expected results, it can be determined that the chip is not performing as expected.

Achieving higher scan compression and test efficiency is an ever increasing goal. Faster testing can allow faster production, decrease cost and increase revenue. Further, new fault models for higher quality, such as small-delay defect testing, cell aware testing and others, inflate the scan-volume significantly. And the impact made by growing test times is multiplicative because test time is a recurring cost for each device shipped. Faster solutions are thus needed to allow faster testing.

The time needed to perform a test on a chip may be described by Equation 1.

$$\text{Test Time} = \text{chain length} * \text{shift frequency} * \text{number of patterns} \quad \text{Equation 1}$$

In equation one, the chain length is the number of bits of a test pattern. The shift frequency is the rate that bits of data can be input and output from a device under test. And, as indicated by the name, the number of patterns is the number of patterns loaded onto a chip for testing.

As will be appreciated, the cost of a test is a function of the test time. Thus reducing the test time can reduce the test cost. Further, reducing test time can hasten the device production time allowing more chips to be prepared, thereby driving up revenue and relieving shortages.

The variables from Equation 1 that drive the test cost may depend on different factors. The chain length and the number of patterns may be related to the number of pins available for loading data With more pins available, the length of the chains may be reduced More pins also reduces the number of patterns needed. As will be appreciated, greater pin availability allows decompression and compression logic to perform better, thus reducing the number of patterns used to perform tests.

The shift frequency is limited by the speed of the scan out from the chip to the off-chip testing equipment. The scan outs have a load on the external tester, which drives the external logic (on an ATE, for example). The external load also has a capacitance that slows how fast the scan outs can travel. This contrasts with scan in because scan in supports logic sitting internally on the chip, so it is easier to shift data in for the local load. As a result, the scan in is faster than scan out, and scan out bottlenecks the process. In some cases, scan in may be two or three times as fast as scan-out.

Embodiments of the present disclosure leverage the relative speed advantage provided by scan in and increase the number of pins available for scanning. This provides improved reductions in test time by addressing the variables driving test time and, thus, test cost.

Figure 2:
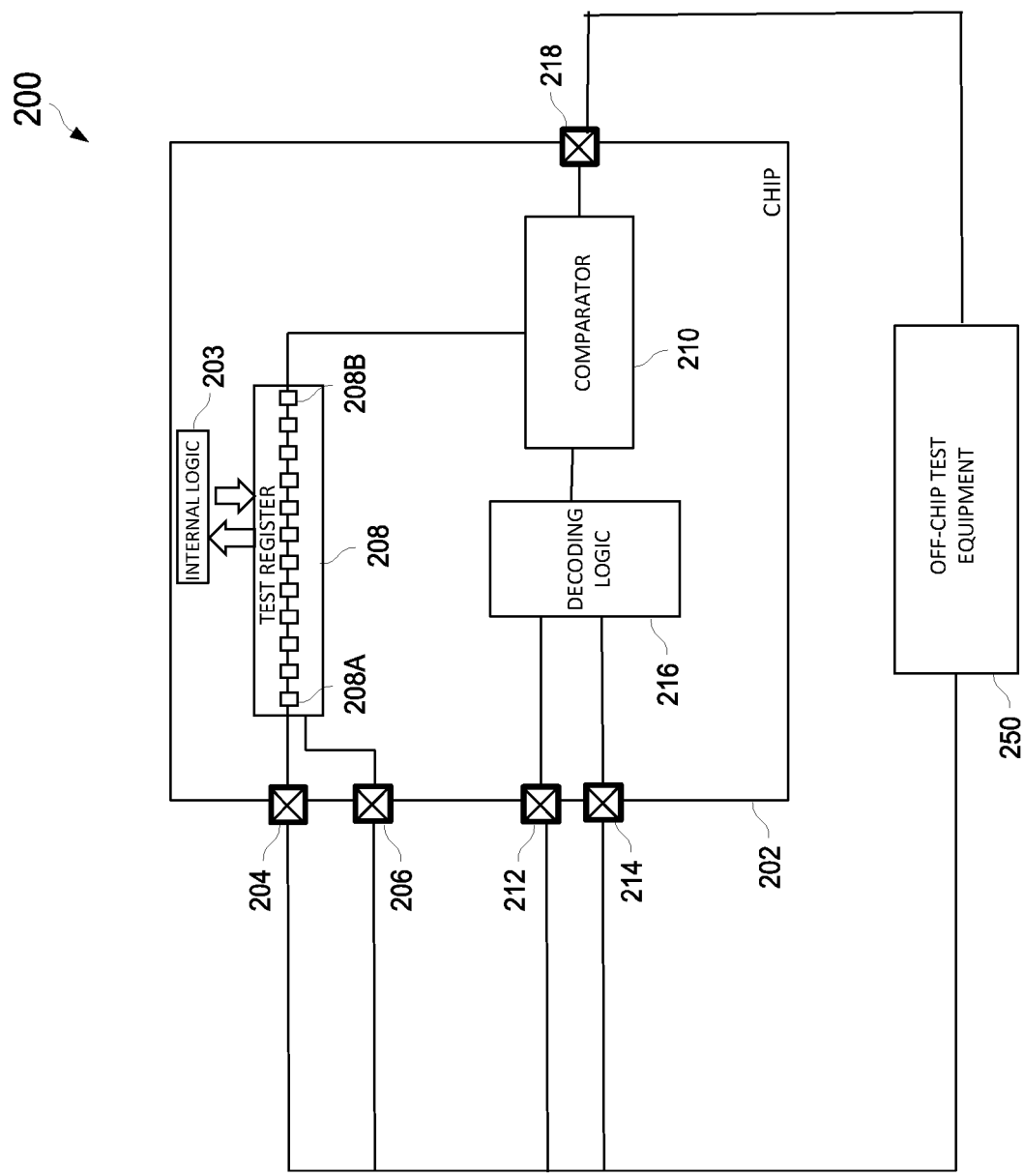
FIG. 2 depicts an on-chip comparison system with smart masking in accordance with embodiments.

FIG. 2 depicts an on-chip comparison system with smart masking in accordance with the embodiments of the present invention.

The on-chip comparison system 200 may comprise a chip 202 or other electronic device. As will be appreciated, it may be advantageous to perform various functionality, performance, quality, or stress tests for the chip 202 (or other electronic device under test). Testing may be performed in conjunction with off-chip testing equipment 250 (or off device), such as an ATE. An ATE may provide test data to the chip 202 using input pins. A first input pin 204 may receive a first scan-in chain. As will be appreciated, various embodiments may comprise more input pins. Additional input pins may receive additional scan-in chains from off-chip testing equipment 250. The more pins utilized for inputting data, the more scan-in chains may be provided, the length of the scan-in chains may be reduced, and the faster data may be inputted. The chip 202 may further comprise a clock input 206 to receive a clock signal. The clock signal may be received from the off-chip test equipment 250. Scan-in chains received at the inputs may be in a compressed form. Decompression logic may expand data signals received from the input pins. As will be appreciated, the number of internal data streams available to be extracted from a data signal received from off-chip testing equipment may depend on the number of pins accessible to transfer the data. For simplicity, decompressor logic is not depicted in FIG. 2.

Data received through the input pins may be provided to test registers on the chip 202. For example, a first test register 208 may receive a section of scan-in data. Various embodiments may comprise different number of test registers for receiving different numbers of scan-in chains. As will be appreciated, multiple test registers may be needed for each scan-in chain because each scan-in chain may be expanded by the decompression logic. As already referenced, the number of scan-in chains available may depend on the number of pins accessible for receiving data from off-chip test equipment (such as an ATE).

The first test register 208 may comprise a number of flip-flops for storing data received. Different numbers of flip-flops may be used in different embodiments. The number of flip-flops for the test registers may depend on the length of the scan-in chain.

As will be appreciated, data may be loaded serially into the test registers. On each cycle of a clock signal (for example, clock signal received at the clock input 206), one bit of data may be loaded into each test register. In embodiments with multiple test registers, each register may be serially loaded in parallel. For example, in an embodiment with 1000 test registers, each of the 1000 test registers may be loaded with one bit of data on a first cycle. Additional bits may be loaded and shifted in accordance with scan-shift operations. Using the first test register as an example, on a first cycle, data may be loaded into a first flip 208A of the first test register 208. On a second cycle, data may be shifted to a second flip-flop. Data may continue to be shifted until an Nth flip flop 208B of the first test register is filled. Additional test registers may also be loaded simultaneously in the same way.

Once test data is loaded into the test registers, the data stored in the test registers may be used for performing different tests for the chip. For example, the data may be used to test for stuck-at faults in the chip's internal logic circuitry. Data from the test registers may be carried to other parts of the chip 202 using internal logic 203. This may be performed using scan load, unload and capture operations.

As will be appreciated, the test registers may comprise input and output shift modes for shifting data and out serially. The test registers may also comprise parallel in and parallel out modes for loading data in and out of all the flip-flops of a test register in parallel. Once loaded with data from the off-chip testing equipment (such as an ATE), the data from the test registers may output data from the flip flops in parallel to perform testing operations. When tests are complete, the results may be loaded into the test registers. Test-result data may be loaded into the test registers in parallel.

In various embodiments, the chip 202 may comprise a comparator 210. The comparator 210 may be used to compare expected test results for the test operations with the actual test results. The comparator may be in communication with the test registers, such as the first test register and any additional test registers, to receive the test-result data from the test registers after the test-result data has been loaded into the test register. In various embodiments, compressor logic may compress the data from the test registers before it is provided to the comparator 210. The comparator may thus receive scan-out chains. The test registers may operation in a shift mode to output the test results serially to the compression logic and then to the comparator 210. Compression logic is not depicted in FIG. 2 for simplicity.

The comparator 210 may receive the expected test results from off-chip test equipment. As will be appreciated, there may be situations where a comparison of one or more bits of data may not be desired. It may be desirable to mask a comparison when there is some uncertainty about data captured for the relevant cycle or the data may not be valid for any number of possible reasons. Timing exceptions provide one possible example where this may be the case.

Data input from the off-chip testing equipment (such as an ATE) for comparison with the test results may comprise one of three states: a high state, a low state, or a masked state. As will be readily appreciated, more than one binary pin is needed to carry three-states of information for each scan chain.

Using a three scan-chain embodiment as an example, each of the three scan chains may comprise a high or low state depending on the expected result or a masked state. The state may be determined by a signal received from the off-chip testing equipment. A signal for three three-state scan chains cannot be carried in one cycle on three pins. And using two pins for each scan chain (a total of six pins)consumes pin resources that could otherwise be used to load scan-in data and expedite test time. The number of pins needed to carry these three states can be reduced by encoding expected result data with the masking data on shared pins. For example, three scan chains with three possible states yield twenty-seven possible combinations for the three scan chains. Using a merged expected test result and masking-instruction signal, this data may be transmitted using only five pins (rather than six). Decoding logic can then be used to extract the appropriate data or masking signal. And the extra pin may be used for another purpose. The more scan chains, the more advantageous this approach becomes because more pins may be saved for other uses.

The chip 202 may comprise an input pin 212 and an input pin 214. Expected test results may be loaded on the chip 202 from the data input pin 212. As will be appreciated, various embodiments may comprise additional input pins and additional masking pins for inputting a merged expected test result and masking-instruction signal. For example, for the example described in the previous paragraph, five pins may be utilized to receive a merged expected test result and masking-instruction signal The merged expected test result and masking-instruction signal may be provided to decoding logic 216. The decoded expected results may be provided to comparator 210 for comparison with the actual test results when the expected test results are not masked. As will be appreciated, masking may be accomplished by translating received data in constant value using AND/OR gating.

Results of the comparisons may be output at an output port 218. Using a comparator 210 on the chip 202 to perform comparisons of the expected results with the actual test results may reduce the number of output pins needed for output data. This is accomplished by using input pins to transmit the expected test-result data onto the chip 202 rather than using output pins to transmit the actual results to off-chip testing equipment (such as an ATE). For example, results from 20 (or more) scan chains may be output by a single output port rather than 20 (or more) output ports. This trade leverages the speed advantage that the input pins have over output pins, so the overall test-time speed is increased. And using a merged expected test result and masking-instruction signal to transmit data on shared pins frees up additional pins rather than having dedicated pins for masking and expected test results.

Figure 3:
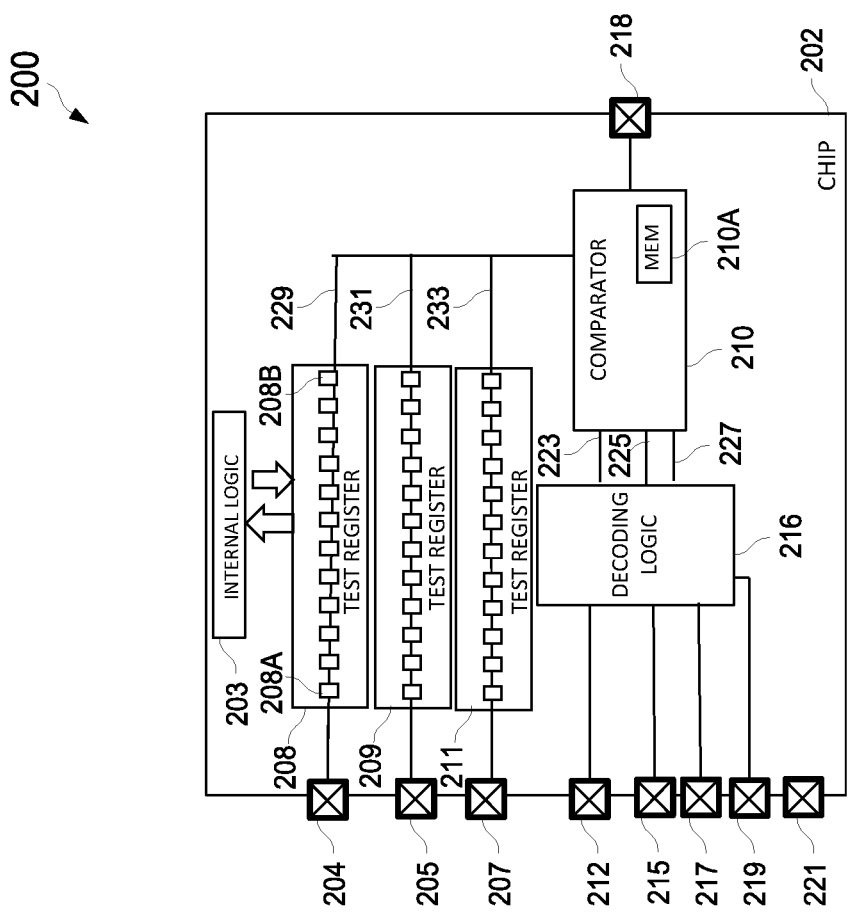
FIG. 3 depicts an on-chip comparison system with smart masking in accordance with embodiments.

FIG. 3 depicts an on-chip comparison system with smart masking in accordance with the embodiments of the present invention.

As previously referenced, the chip 202 may comprise additional registers and inputs. FIG. 3 depicts a chip 202 comprising three test registers. This is but one example and a chip 202 may have any number of test registers in various embodiments. As will be appreciated, the number of test registers in a chain may depend on the number of inputs reserved for scan-in chain and the expansion capabilities of any decompression logic.

As depicted in FIG. 3, the chip 202 may comprise a second test register 209, and a third test register 211. The second test register 209 may be loaded with test data for a second scan in chain. The third test register 211 may be loaded with data from a third scan-in chain. It should be appreciated that in various embodiments, multiple test registers may be used to store data from a single scan-in chain (or input) due to decompression logic (not depicted in FIG. 3). For example, additional test registers may also store data from the first scan chain, second scan chain, and third scan chain.

Once loaded into test registers, the data may be used to perform tests on the chip 202. Results from the second scan chain may be stored on the second test register 209. Results from the scan chain may be stored on the third test register 211. The second test register 209 and the third test register may be loaded serially, and test results may be output serially to the comparator 210. For performing tests on the chip 202, the second test register 209 and the third test register 211 may be output in parallel and loaded with test results. The second test register 209 and third test register 211 may each also comprise any number of flip flops for storing data. The chip 202 may comprise any number of additional test registers, as will be appreciated.

The chip 202 may comprise a second input 205 and a third input 207. As will be appreciated, the chip 202 may comprise additional inputs in various embodiments. The second input 205 may receive a second scan-in chain and provide test data from off-chip test equipment (such as an ATE) to the second test register 209. The third input 207 may receive a third scan-in chain and provide test data from off-chip test equipment (such as an ATE) to the third test register 211. It should also be appreciated that the chip 202 may comprise decompression logic and compression logic (not depicted in FIG. 3) to expand scan-in chains before the test is provided to the test registers and to compress test-result data before it is provided to a comparator 210. Accordingly, the number of test registers loaded with test data may be greater than the number of inputs used to receive the data from off-chip test equipment (such as an ATE). FIG. 3 omits a clock signal for simplicity. However, it should be appreciated that the chip 202 may comprise an input to receive a clock signal, or clock signals, that are carried to on chip components (such as the test registers).

Test results stored in the first test register 208, second test register 209, and third test register 211 may be provided to the comparator 210. The results may be compressed in scan-out chains using compression logic (not depicted in FIG. 3) before they are provided to the comparator. Expected results for the scan out chains received by the comparator may be loaded from off-chip test equipment (such as an ATE). Data for masking comparisons may also be loaded from off chip test equipment (such as an ATE).

In various embodiments, a merged signal comprising the expected results and masking indicators for the test chains may be received from off-chip test equipment 250 using the same input pins. As will be appreciated, the number of pins used to transmit a merged signal comprising expected results and masking indications may depend on the number of scan-out chains for which comparison is desired.

As depicted in FIG. 3, data from five input pins may be provided by the decoding logic 216 to provide expected results and masking indicators to allow on-chip comparisons for three scan-out chains of test results. Decoding logic 216 may be coupled with comparator 210 and provide an output to the comparator 210 that depends on the merged signal received by the decoding logic 216. A first decoded output 223 of the decoding logic 216 may be provided to the comparator 210. A second decoded output 225 of the decoding logic 216 may be provided to the comparator 210. A third decoded output 227 of the decoding logic 216 may be provided to the comparator 210.

The decoding logic 216 may receive inputs from five input pins. For example, data input pin 212, data input pin 215, data input pin 217, data input pin 219, and data input pin 221. In various embodiments, any number of input pins may be used to receive merged expected test-result and masking-instruction signal and provide it to decoding logic 216.

Each of the first decoded output 223, the second decoded output 225, and the third decoded output 227 may comprise one of three states. The three states may include a "high" state, a "low" state, and a "mask" state. The state may depend on the merged expected test result and masking-instruction signal received by the decoding logic 216.

As will be appreciated, there may be additional three-state decoded outputs in various embodiments. The decoder logic 216 may comprise a three-state decoded output for each scan-out chain so that each scan-out chain is masked or compared with an expected test result for the corresponding scan-out chain (either "high" or "low"). The merged expected test result and masking-instruction signal may be received by the chip 202 by less than 2*N inputs, where N is the number of scan-out chains of test results received by comparator 210.

Using a merged expected test result and masking-instruction signal carried on shared pins allows more efficient use of the data pins to encode the three-state of outputs used to transmit expected results and masking indications to the comparator 210. As referenced earlier in this disclosure, a signal for three three-state outputs may be carried on five binary input pins (for example, data input pin 212, data input pin 215, data input pin 217, data input pin 219 and data input pin 221). The 27 possible states for the data signals having one of three states may be described with five binary inputs.

FIG. 7 depicts an example table mapping five binary input states to data having one of three states. The scan-out values of Table 700 may correspond the decoded outputs of FIG. 3. For example, SO_0 of Table 700 may correspond to the first decoded output 223, SO_1 of Table 700 may correspond to the second decoded output 225, and SO_2 of Table 700 may correspond to the third decoded output 227. For the purposes of Table 700, a "0" may correspond to a low state for an expected test result, a "1" may correspond to a high state, and an "M" may correspond to a mask state. The cells for scan pins from Table 700 may correspond to the input pins of FIG. 3. For example, RSI0 may correspond to data input pin 212, RS1 may correspond to data input pin 215, RS2 may correspond to data input pin 217, RS3 may correspond to data input pin 219, and RS4 may correspond to data input pin 221.

As will be appreciated, and as demonstrated by Table 700, all 27 possible states of the decoded outputs may be corresponded to one of the thirty-two possible states allowed by five input pins. Various embodiments may use more input pins for providing expected results and masking instructions for more test chains. The number of pins for encoding a merged expected test result and masking-instruction signal may be described by Equation 2, below.

$$\text{Input Pins} = \text{ceiling}[\text{LOG}_2(3^{Scanouts})] \qquad \text{Equation 2}$$

In Equation 2, input pins refer to the number of pins for receiving the merged expected test result and masking-instruction signal. ScanOuts refers to the number of three-state outputs from the decoding logic 216, which, as will be appreciated, may be equal to the number of scan-out chains of test results received by comparator 210. It should also be appreciated that more than one output pin may be used for carrying decoded output data that may comprise one of three states. And, the function ceiling[*] maps the value * to the least integer greater than or equal to *. For example, where *=4.7, ceiling[*] equals 5. The number of input pins, thus, may depend on the number three-state outputs desired. Using Equation 2, 16 input pins may be used for receiving a merged expected test result and masking-instruction signal for 10 scan chains.

It will be appreciated that the decoding logic 216 may be implemented in differently in various embodiments. For example, decoding logic 216 may be implemented with a circuit of logic gates.

The outputs from the decoding logic 216 may be compared with actual test results from the test registers using the comparator 210. For example, if the first decoded output 223, second decoded output 225, and third decoded output 227 comprise expected test results (high or low), they may be compared with actual test results received by the comparator. The expected result from the first decoded output 223 may be compared with the actual result from a first scan-out chain 229. The expected result from the second decoded output 225 may be compared with the actual result from a second scan-out chain 231. The expected result from the third decoded output 227 may be compared with the actual result from a third scan out chain 233. In various embodiments, additional decoded outputs comprising expected test results may be compared with actual test results from scan-out chains. As will be appreciated, the output from test registers (such as the first test register 208, second test register 209, third test register 211, and additional test registers) may be compressed into scan-out chains transmitted to the comparator 210. When a decoded output comprises a mask state, the comparison may be masked.

The chip 202 may comprise an output port 218. The output port 218 may comprise a single bit. The output port 218 may output the results of the comparison done by the comparator 210. For example, the signal provided to the output port 218 from the comparator 210 may be asserted when expected test results (communicated via decoder logic 216) match the actual test results (received from test registers). It will be appreciated that a signal may be de-asserted when expected test results do not match actual test results. In various embodiments, results from a comparison may be output every cycle a comparison is made.

In various embodiments, the comparator 210 may comprise a memory 210A. The memory may store the results of comparisons made by the comparator 210. For example, the memory 210A may comprise a shift register. The memory 210A may comprise flip flops to store comparison results. The results of each comparison may be accumulated in the memory 210A. As will be appreciated, test results may be output in different ways or at different times in various embodiments. For example, comparisons from each chain may be output each cycle, once per pattern, or after all tests have been completed. In various embodiments, results from all chains may be aggregated and output once per cycle, once per pattern, or after all tests have been performed. In various embodiments, results may be output after a specified number of comparisons have been performed. In various embodiments, comparison results may be stored on a per-pattern basis. For example, a single bit of memory may indicate if the expected results for a full pattern match the actual results for the full pattern. In various embodiments, the comparator may store results for each individual scan-out chain or store the results of multiple comparisons for each scan out chain. In various embodiments, the comparator may only store a single result for the combined comparison of all the scan chains.

A count of the number of cycles, patterns or other means to track the progression of the tests may be reset after the results are output. Comparison results may then be automatically output each time the count reaches a desired threshold (patterns, cycles, or any other means to track the progression of tests) and reset again. In other embodiments, comparison results stored in memory 210A may be output in response to an output directed received from off-chip equipment (such as an ATE) or an on chip component.

It will be appreciated that the comparator 210 may comprise numerous different forms. For example, in various embodiments, the comparator may comprise individual comparators for each scan chain that are configured to receive a scan-out chain and a decoded output from the decoder logic 216. In various embodiments, the comparator may comprise a single comparator that receives all the scan-out chains and all the decoded outputs from the decoder logic 216.

Figure 4:
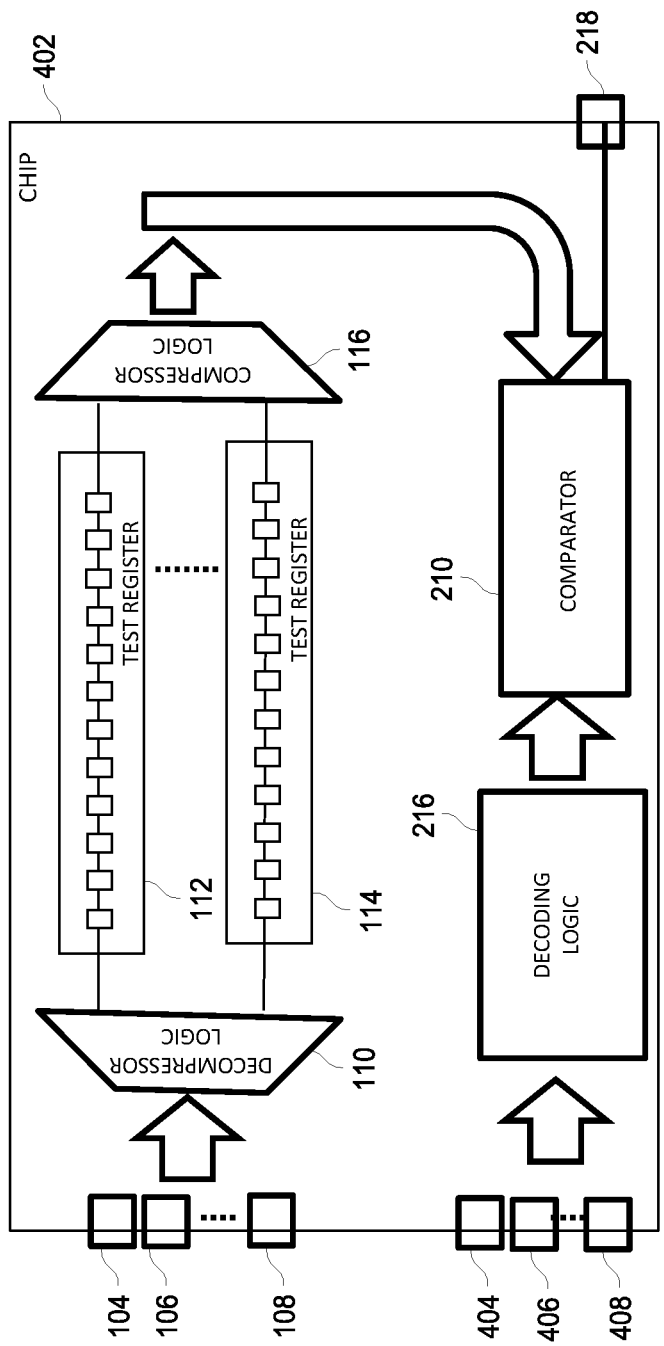
FIG. 4 depicts an on-chip comparison system with smart masking in accordance with embodiments.

FIG. 4 depicts an on-chip comparison system with smart masking in accordance with the embodiments of the present invention.

In various embodiments, the chip 402 may comprise a first merged input 404, a second merged input 406, and an Nth merged input 408. The merged inputs may receive the merged expected test result and masking-instruction signal from off-chip test equipment 250.

As will be appreciated, a plurality of devices may be tested simultaneously with one off-chip test equipment.

Figure 5:
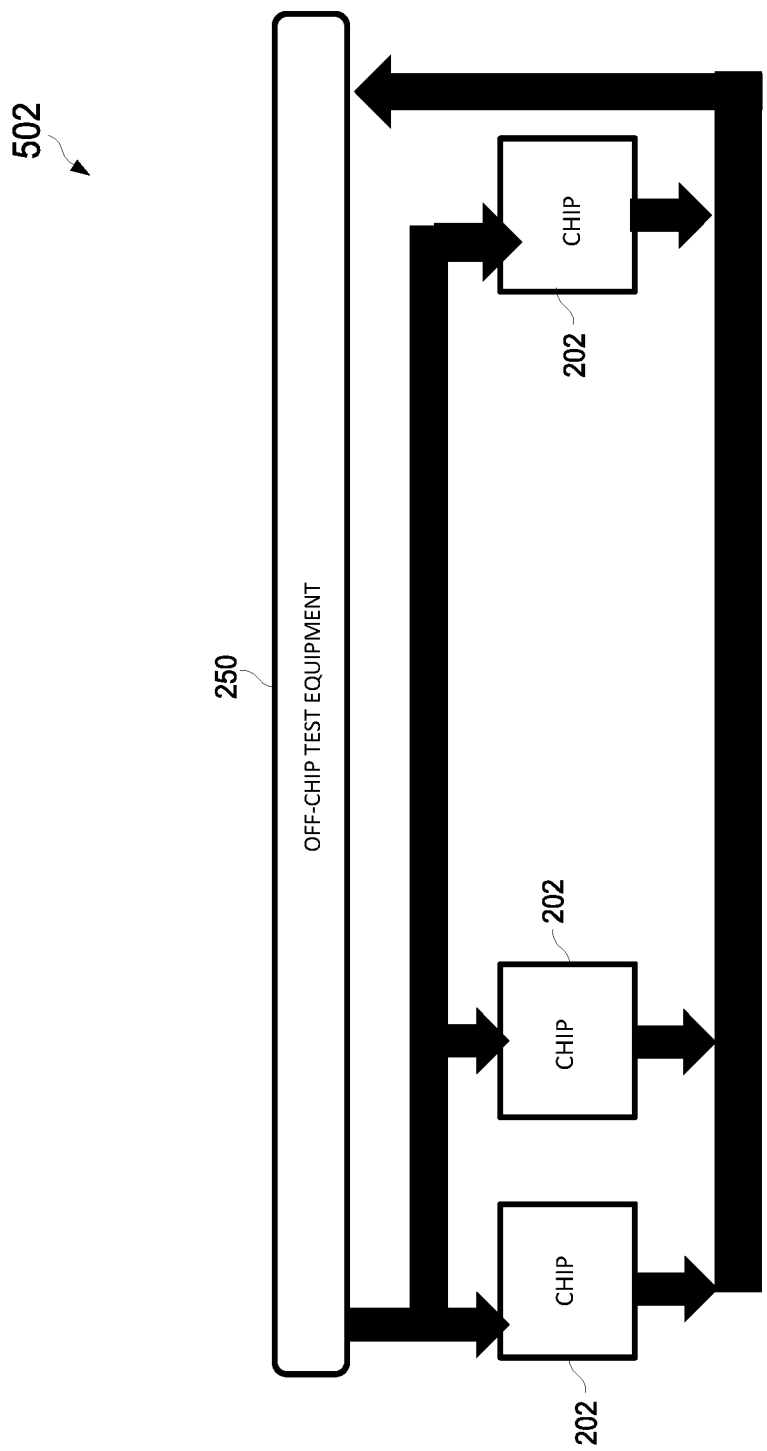
FIG. 5 depicts a system for testing a plurality of chips

FIG. 5 depicts a system for testing a plurality of chips.

System 502 may comprise off-chip test equipment 250 coupled with a plurality of devices under test, each of which may comprise a chip 202. The off-chip test equipment 250 may send data to each device under test to perform test operations. The off-chip test equipment 250 may also provide expected result data and masking indications to the devices under test, each of which may comprise a chip 202. Test results may be compared with expected results on the devices under test. And, each device under test, each of which may comprise a chip, may output the results to the off-chip test equipment. Output for each device under test may comprise a single bit, while the inputs may comprise multiple channels of data. As will be appreciated, input data may be broadcast to multiple chains using the same input data for each chip being tested. Access to more inputs due to single-bit outputs thus allows more devices to be tested using a single ATE.

Figure 6:
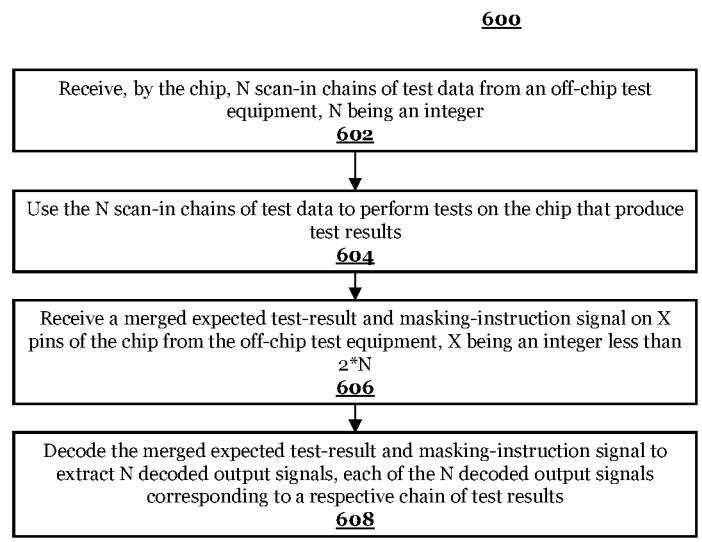
FIG. 6 depicts a method for testing a chip with an on-chip comparator in accordance with embodiments.

FIG. 6 depicts a method for testing a chip with an on-chip comparator in accordance with embodiments.

In various embodiments, the method 600 comprises at step 602, receiving, by the chip, N scan-in chains of test data from an off-chip test equipment, N being an integer; at step 604, using the N scan-in chains of test data to perform tests on the chip that produce test results; at step 606, receiving a merged expected test-result and masking-instruction signal on X pins of the chip from the off-chip test equipment, X being an integer less than 2*N; and at step 608, decoding the merged expected test-result and masking-instruction signal to extract N decoded output signals, each of the N decoded output signals corresponding to a respective chain of test results.

In various embodiments, method 600 may further comprise, for each decoded output signal comprising an expected test result, using the on-chip comparator to compare the decoded output signal with the respective chain of test results for that decoded output signal.

In various embodiments, the method 600 may further comprise, for each decoded output signal comprising a masking condition, masking from comparison the respective test chain of test results for that decoded output signal.

In various embodiments, method 600 may further comprise decompressing the N scan-in chains and serially loading a plurality of test registers with test data extracted from the N scan-in chain.

In various embodiments, method 600 may further comprise storing results from test results in the plurality of test registers.

In various embodiments, method 600 may further comprise compressing test results output from the test registers into N chains of test results.

In various embodiments, method 600 may further comprise setting the integer X to a least integer greater than or equal to $\log_2(3^N)$.

In various embodiments, method 600 may further comprise using a single-bit output comparison result.

In various embodiments, method 600 may further comprise storing comparison results on the chip.

In various embodiments, method 600 may further comprise outputting comparison results after a set number of comparisons have been made.

In various embodiments, method 600 may further comprise, wherein each of the N decoded output signals comprises data having one of three states In various embodiments, method 600 may further comprise, wherein the merged expected test-result and masking-instruction signal is received from the off-chip testing equipment.

In various embodiments, method 600 may further comprise outputting comparison results to the off-chip test equipment.

Figure 8:
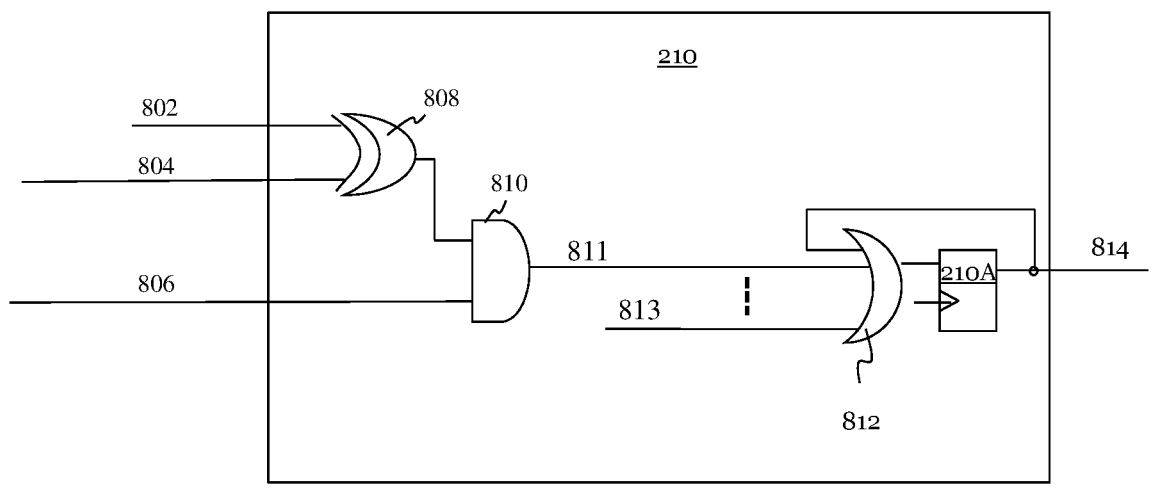
FIG. 8 depicts a comparator consistent with embodiments.

FIG. 8 depicts a comparator consistent with embodiments.

In various embodiments, the comparator 210 may comprise an input 802 to receive test-data results. This may be received directly from test registers. In various embodiments, test data results may be received from compression logic, such as compressor logic 116. For simplicity, FIG. 8 only depicts a single input for receiving test results, but the comparator may receive any number of results. The number of inputs the comparator 210 for receiving test data results may correspond to the number of scan chains being compared.

The comparator 210 may comprise an input 804 to receive decoded expected test results. This may originate from decoding logic 216. For example, the first decoded output 223. Again, as appreciated, the comparator 210 may also comprise additional inputs to receive decoded expected results and masking indications for additional comparisons (scan chains).

The test results received at input 802 and the expected result received at input 804 may be provided to an XOR gate 808. The masking indicator received at input 806 may be provided to an AND gate 810 along with an output of the XOR gate 808. As will be appreciated, the comparator may also comprise additional XOR gates for receiving expected test results and actual test results from additional scan chains and additional AND gates for receiving additional masking inputs. Results may be aggregated, in various embodiments, for example, with an OR gate 812. An input 811 may carry comparison results from a first scan chain. An input 813 may carry comparison results from an Nth scan chain. This may allow the output of the OR gate 812 to be asserted if expected results from any scan chain deviate from actual test results. Output from the OR gate 812 may be provided to a memory 210A, which may comprise a flip flop. Output of the flip flop may also be fed back to the OR gate 812 so that once a deviation is detected the output may be maintained until the flip flop is reset. This allows all results to be tracked by a single flip flop. As will be appreciated, FIG. 8 depicts but one example of comparator 210 and other architectures may be used in various embodiments. A comparator output 814 may provide results of comparisons. For example, the comparator output 814 may be coupled with output port 218**.

Figure 9:
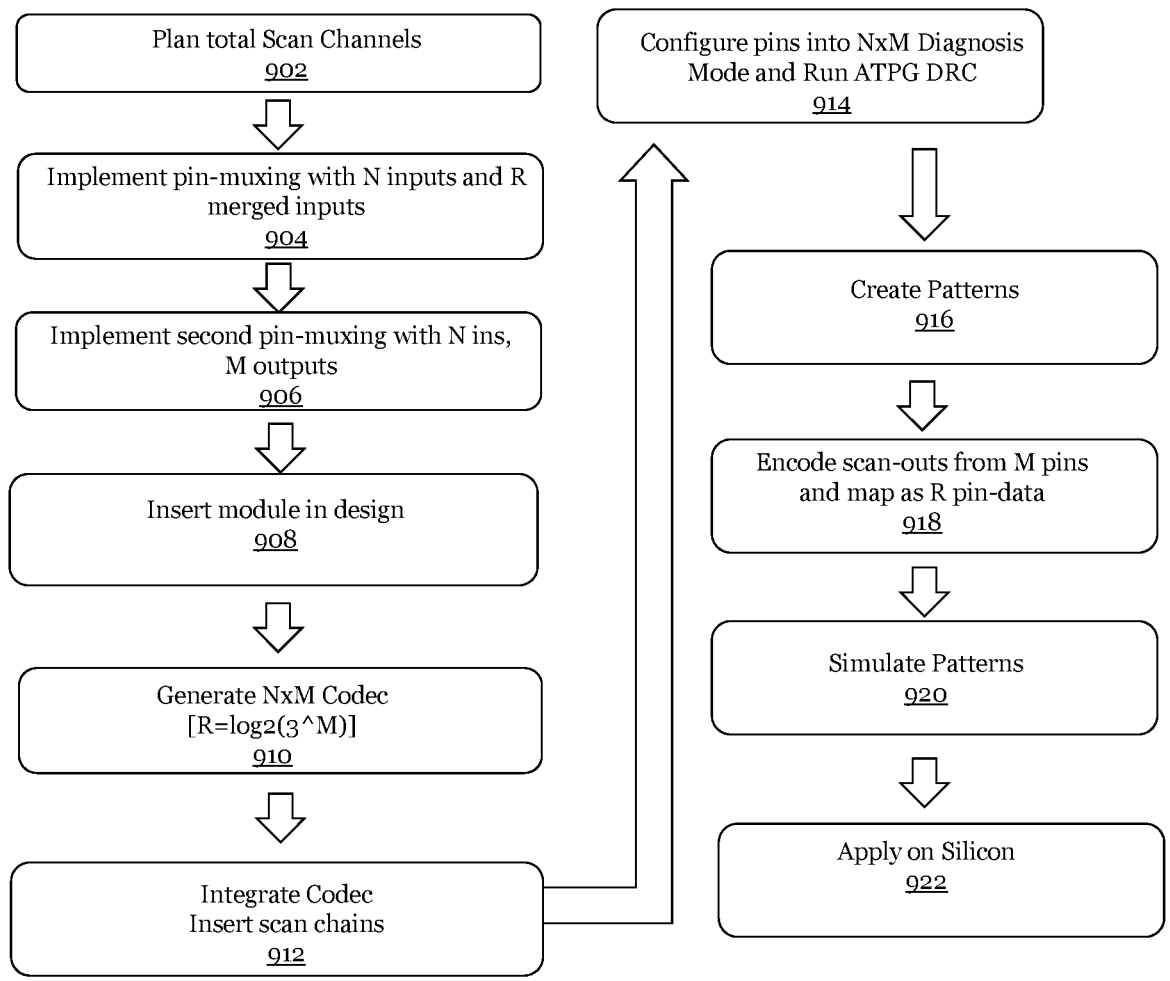
FIG. 9 depicts a flow chart fora method for a design for testability flow in accordance with embodiments.

FIG. 9 depicts a flow chart for a method for a design for testability flow in accordance with embodiments.

At step 902, the method comprises planning for the number of channels for a chip (such as chip 202). At step 904, method 900 comprises implementing pin-muxing with N inputs and R merged inputs. The N inputs may correspond to the inputs for carrying the scan chain test data. For example, input pin 204. The R merged inputs may correspond to inputs that carry a merged expected test result and masking-instruction signal. For example, input pin 212, input 215, etc.

The method 900, may comprise, at step 906, implementing a second pin-muxing with N inputs and M outputs. Here, M may correspond to the number of scan out chains that may be used for on-chip comparisons. At step 908, the method may comprise inserting modules into a chip design such as a comparator 210 and decoding logic 216. The method may comprise, at step 910, generating an N×M codec. As will be appreciated, the number of inputs for carrying the merged expected test result and masking-instruction signal may be selected in accordance with Equation 2. At step 912, the method may comprise integrating the codec generated at step 910 and inserting scan chains. Device registers may be stitched into multiple shift registers (scan chains) and connected between a codec decompressor and compressor.

At step 914, method 900 may comprise configuring pins into an N×M diagnosis mode for performing tests and running Automatic Test Pattern Generation Design Rules Checking. Method 900 may comprise, at step 914, creating the test patterns. And, at step 918, method 900 may comprise encoding scan-outs from M pins and mapping as R pin-data. Method 900 may comprise, at step 920 simulating patterns. Pattern simulation may be performed to verify sanctity. At step 922, the method may comprise applying the patterns to a chip.

Example 1. A method for testing a chip with an on-chip comparator, the method comprising: receiving, by the chip, N scan-in chains of test data from an off-chip test equipment, N being an integer; using the N scan-in chains of test data to perform tests on the chip that produce test results; receiving a merged expected test-result and masking-instruction signal on X pins of the chip from the off-chip test equipment, X being an integer less than 2*N; decoding the merged expected test-result and masking-instruction signal to extract N decoded output signals, each of the N decoded output signals corresponding to a respective chain of test results; for each decoded output signal comprising an expected test result, using the on-chip comparator to compare the decoded output signal with the respective chain of test results for that decoded output signal; and for each decoded output signal comprising a masking condition, masking from comparison the respective test chain of test results for that decoded output signal.

Example 2. The method of Example 1 further comprising decompressing the N scan-in chains and serially loading a plurality of test registers with test data extracted from the N scan-in chain.

Example 3. The method of Example 1 or Example 2, further comprising storing results from test results in the plurality of test registers.

Example 4. The methods of Example 1 through Example 3, further comprising compressing test results output from the test registers into N chains of test results.

Example 5. The methods of Example 1 through Example 4, further comprising setting the integer X to a least integer greater than or equal to $\log_2(3^{\wedge}(N))$.

Example 6. The methods of Example 1 through Example 5, further comprising using a single bit output comparison results.

Example 7. The methods of Example 1 through Example 6, further comprising storing comparison results on the chip.

Example 8. The methods of Example 1 through Example 7, further comprising outputting comparison results after a set number of comparisons have been made.

Example 9. The methods of Example 1 through Example 8, wherein each of the N decoded output signals comprises a three-state signals.

Example 10. The methods of Example 1 through Example 9, wherein the merged expected test-result and masking-instruction signal is received from the off-chip testing equipment.

Example 11. The methods of Example 1 through Example 10, further comprising outputting comparison results to the off-chip test equipment.

Example 12. A chip an on-chip comparator, the chip comprising: N input pins configured to receive N scan-in chains that comprise test data, N being an integer; a plurality of scan-chain test registers configured to store test data from the N scan-in chains for on-chip tests and to store results from on-chip tests; decoding logic configured to receive a merged test-result and masking-instruction signal from X input pins and output N decoded output signals decoded from the merged test-result and masking-instruction signal wherein X is an integer less than 2*N; and wherein the on-chip comparator is coupled with the plurality of scan-chain test registers to receive test results from the plurality of scan-chain test registers and wherein the on-chip comparator is coupled with the decoding logic to receive the N decoded output signals, the on-chip comparator being configured to compare each of the N decoded output signals comprising an expected test result with a respective test result chain and configured to mask from comparison each of the N decoded output signals comprising a mask instruction.

Example 13. The chip of Example 12, further comprising decompressing logic configured to receive the N scan-in chains from the N input pins and output test data to the plurality of scan-chain test registers, the integer N being less than the number of scan-in test registers.

Example 14. The chip of Example 12 or Example 13, further comprising compression logic configured to receive output from the plurality of scan-chain test registers and compress it into N test chains, the compression logic being coupled with the on-chip comparator to provide the N test chains to the on-chip comparator.

Example 15. The chips of Example 12 through Example 14, wherein the on-chip comparator further comprises a memory configured to store comparison results.

Example 16. The chips of Example 12 through Example 15, further comprising an output coupled with the on-chip comparator to output comparison results.

Example 17. The chips of Example 12 through Example 16, wherein the output comprises a single bit.

Example 18. The chips of Example 12 through Example 17, where the integer X is equal to a least integer greater than or equal to $\log_2(3^{\wedge}(N))$.

Example 19. A system to test a chip, the system comprising: an off-chip test equipment; N input pins coupled with the off-chip test equipment to receive N scan-in chains that comprise test data, N being an integer; a plurality of scan-chain test registers configured to store test data from the N scan-in chains for on-chip tests and to store results from on-chip tests; decoding logic configured to receive a merged test-result and masking-instruction signal from X input pins and output N decoded output signals decoded from the merged test-result and masking-instruction signal wherein X is an integer less than 2*N, the X input pins being coupled with the off-chip testing equipment; and an on-chip comparator is coupled with the plurality of scan-chain test registers to receive test results from the plurality of scan-chain test registers and wherein the on-chip comparator is coupled with the decoding logic to receive the N decoded output signals, the on-chip comparator being configured to compare each of the N decoded output signals comprising an expected test result with a respective test result chain and configured to mask from comparison each of the N decoded output signals comprising a mask instruction.

Example 20. The chip of Example 19, where the integer X is equal to a least integer greater than or equal to $\log_2(3^{\wedge}(N))$.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments. Unless noted otherwise, elements identified with the same numbering in figures of this disclosure, refer to the same components.

What is claimed is:

1. A method for testing a chip, the method comprising:
specifying a first pin assignment with N input pins and R merged input pins, N and R being integers, N corresponding to a number of input pins for carrying scan-in chain test data, and R corresponding to a number of input pins for carrying a merged expected test result and a masking instruction signal;
specifying a second pin assignment with N input pins and M output pins, M being an integer and corresponding to a number of output pins for carrying scan-out chain test data;
generating an N by M codec;
integrating the N by M codec and inserting scan chains, wherein device registers are stitched into multiple scan chains and coupled between a compression circuit and a decompression circuit;
decoding output signals from the merged expected test result and the masking instruction signal received from the R merged input pins;
receiving the scan-in chain test data; and
comparing the decoded output signals comprising an expected test result with a test result chain.

2. The method of claim 1, wherein R equals, or is greater than, $\log_2(3^N)$.

3. The method of claim 1, further comprising configuring pins of the chip into an N by M diagnosis mode to perform tests on the chip.

4. The method of claim 3, wherein an automatic test pattern generating (ATPG) tool runs the tests on the chip.

5. The method of claim 4, wherein the ATPG tool generates test patterns to test the chip.

6. The method of claim 1, further comprising encoding scan-out chain test data from M pins and mapping the encoding as R pin test data.

7. The method of claim 1, further comprising simulating test patterns comprising verifying sanctity of test patterns.

8. A chip, comprising:

N inputs pins, N being an integer and corresponding to a number of input pins for carrying scan-in chain test data;

R merged input pins, R being an integer and corresponding to a number of input pins for carrying a merged expected test result and a masking instruction signal;

M output pins, M being an integer and corresponding to a number of output pins for carrying scan-out chain test data;

a plurality of device registers stitched into multiple scan chains based on an integrated N by M codec, the device registers coupled between a compression circuit and a decompression circuit;

a decoding logic circuit configured to decode output signals from the merged expected test result and the masking instruction signal received from the R merged input pins; and a comparator circuit configured to receive the scan-in chain test data and compare the output signals from the decoding logic circuit comprising an expected test result with a test result chain.

9. The chip of claim 8, wherein R equals, or is greater than, $\log_2(3^N)$.

10. The chip of claim 8, wherein pins of the chip are configured into an N by M diagnosis mode to perform tests on the chip.

11. The chip of claim 10, wherein an automatic test pattern generating (ATPG) tool runs the tests on the chip.

12. The chip of claim 11, wherein the ATPG tool generates test patterns to test the chip.

13. The chip of claim 8, wherein scan-out chain test data is encoded from M pins and mapped as R pin test data.

14. The chip of claim 8, wherein test patterns are simulated to verify sanctity of test patterns.

15. A system to test a chip, the system comprising:

an off-chip test equipment; and the chip coupled to the off-chip test equipment, the chip comprising:

N inputs pins, N being an integer and corresponding to a number of input pins for carrying scan-in chain test data;

R merged input pins, R being an integer and corresponding to a number of input pins for carrying a merged expected test result and a masking instruction signal;

M output pins, M being an integer and corresponding to a number of output pins for carrying scan-out chain test data;

a plurality of device registers stitched into multiple scan chains based on an integrated N by M codec, the device registers coupled between a compression circuit and a decompression circuit;

a decoding logic circuit configured to decode output signals from the merged expected test result and the masking instruction signal received from the R merged input pins; and a comparator circuit configured to receive the scan-in chain test data and compare the output signals from the decoding logic circuit comprising an expected test result with a test result chain.

16. The system of claim 15, wherein R equals, or is greater than, $\log_2(3^N)$.

17. The system of claim 15, wherein pins of the chip are configured into an N by M diagnosis mode to perform tests on the chip.

18. The system of claim 15, wherein the off-chip test equipment comprises an automatic test pattern generating (ATPG) tool to run the tests on the chip, the ATPG tool configured to generate test patterns to test the chip.

19. The system of claim 15, wherein scan-out chain test data is encoded from M pins and mapped as R pin test data.

20. The system of claim 15, wherein test patterns are simulated to verify sanctity of test patterns.

* * * * *